United States Patent [19]

Helgerson

[11] 4,375,050
[45] Feb. 22, 1983

[54] PORTABLE AUTOMATIC MULTIPLE TEST SYSTEM FOR MULTI-PAIR CABLES

[76] Inventor: Ronald C. Helgerson, 4939 SE. 140th, Portland, Oreg. 97236

[21] Appl. No.: 181,937

[22] Filed: Aug. 27, 1980

[51] Int. Cl.³ ............................................. G01R 31/02
[52] U.S. Cl. ......................................... 324/51; 324/66
[58] Field of Search ..................... 324/51, 66, 73 R; 179/175.3 F

[56] References Cited

U.S. PATENT DOCUMENTS

| 3,430,135 | 2/1969 | Mullen | 324/51 |
| 3,699,438 | 10/1972 | Webb | 324/51 X |
| 3,763,430 | 10/1973 | Terrey | 324/51 X |
| 3,800,214 | 3/1974 | O'Flynn | 324/51 |
| 3,818,329 | 6/1974 | Reaves, Jr. | 324/51 |
| 3,986,106 | 10/1976 | Shuck et al. | 324/51 |
| 4,224,690 | 9/1980 | Rockwell | 324/51 X |
| 4,281,283 | 7/1981 | Ross et al. | 324/51 |
| 4,282,479 | 8/1981 | Deboo et al. | 324/51 |
| 4,326,162 | 4/1982 | Hankey | 324/51 |

Primary Examiner—Stanley T. Krawczewicz
Attorney, Agent, or Firm—Donald J. Singer; Stanton E. Collier

[57] ABSTRACT

A portable, compact test set for multi-pair cables having connectors, where the connectors are mated to adapters in the test set and pulses are generated which sequentially test each pair for open and short conditions, using transistor to transistor logic which provides a visual indication of the pair, the wire and the defect detected.

8 Claims, 7 Drawing Figures

# PORTABLE AUTOMATIC MULTIPLE TEST SYSTEM FOR MULTI-PAIR CABLES

STATEMENT OF GOVERNMENT INTEREST

The invention described herein may be manufactured and used by or for the Government for governmental purposes without the payment of any royalty thereon.

BACKGROUND OF THE INVENTION

This invention relates generally to a system for testing multiple pair cables and in particular to such a system that will automatically provide a visual indication of the pair, wire and defect detected in the cable.

The need for a quick, convenient and accurate means for testing multi-paired cables has been well established. The art is replete with various instruments and systems which pretend to be the ultimate time saving—labor saving device. However, with improved technology and changing requirements there are always ways in which the state of the art may be advanced.

Multi-paired cables are best known for their use in telephone systems, but cables of like design are utilized in computer systems and security systems as well. In general, once telephone cables are installed they are left untouched for years and unless disturbed for some reason will function as intended. There are however, situations where cables are installed and removed with reasonable frequency, for example, military field uses (both training and actual), seasonal and temporary recreational uses and construction projects.

One known system for testing multi-paired cables is disclosed in U.S. Pat. No. 3,986,106 issued to Shuck and Hudson on Oct. 12, 1976. The reference discloses other problems and inadequacies of the prior art. Shuck et al present a portable system particuarly adapted for testing installed cables where both ends of the cable are not readily available to the portable master unit. Shuck and Hudson send a pulse through one wire of the pair, then through a resistor network at the remote plug and back through the other wire in the pair (tip and ring wires). The system compares the magnitude of the output pulse with the magnitude of a reference pulse and thereby determines that there is a defect in a designated pair. The system fails to show which wire in the pair is defective or the nature of the defect (short or open). Other prior art systems utilize such conventional test equipment as ohm-volt meters for testing and stepping switches for moving from pair to pair.

The system presented herein utilizes transistor to transistor logic circuitry and provides means for wire pair identification; an indication of the nature of the defect and the specific wire in the pair having the defect.

SUMMARY OF THE INVENTION

The invention provides a portable, lightweight reliable test set for multi-paired cables. The system of the invention is carried in a small box or suitcase like container that is equipped with a source of low voltage, as for example a conventional lantern battery.

The system of the invention is designed to test the most conventional twenty six pair telephone cable but the system could be enlarged or reduced, without invention, to handle larger or smaller cables. In the test set are a pair of cable plug adapters for receiving both ends of the cable in order that the cable, regardless of length, might be connected into the system. There are three controls for the system, a power ON-OFF switch, a start-reset switch and manual advance switch. There are five indicators in the test set. A pair of seven segment LEDs provide a digital indication of the cable pair being tested, an LED indicating a short, an LED indicating an open, an LED indicating a defect in the tip wire of the pair and LED indicating that the ring wire of the pair is defective.

In operation, the operator, after connecting both ends of the cable to the test unit turns the power on and depresses the start switch. The system will scan the cable indicating the pair digitally as it scans. If a defect is found the scanning will stop indicating which pair is defective, an LED will light indicating the wire of the pair having the defect and another light will light indicating the nature of the defect (open or short). The scan is resumed by depressing the advance switch. A full scan of twenty six pair cables without defects is four and one half seconds.

Functionally, when the start switch is depressed a clock begins to generate pulses at approximately sixteen pulses per second. Pulses are fed through a binary coded decimal counter to a digital LED display indicating the pair tested. The pulse is also fed to a binary counter which drives a decoded circuit to provide a pulse to each of the fifty two wires and an additional pulse to end the scan upon completion. After the pulse passes through the cable it is picked up in a wire test output circuit and compares the wire tested for a known condition (good, open or shorted). Output from the test output circuit is fed to an AND gate combiner and an OR gate combiner. The AND gate combiner collects information from all test circuits (52) and combines it so that all tests are combined into one output to drive another OR gate.

The OR gate combiner collects information from all wire test circuits and combines them so that another OR gate can be driven by one output.

The AND gate combiner causes a signal to light the open LED. The OR gate combiner causes a signal to light the short LED.

The so called "other" OR gate receives signals from the decoder, AND gate combiner and OR gate combiner and produces an output which is sent to the clock and stops the clock (and hence the digital display) when a defect is discovered or when the scan is completed.

It is therefore an object of the invention to provide a new and improved portable automatic multiple test system for multi-pair cables.

It is another object of the invention to provide a new and improved automatic test system that is compact and light in weight.

It is a further object of the invention to provide a new and improved lightweight test system that is convenient to carry and requires little or no maintenance.

It is still another object of the invention to provide a test system for testing multi-pair cables that identifies the pair under test and an indication of the nature of the defect.

It is another object of the invention to provide an automatic test system for multi-pair cables that will automatically scan all cable pairs.

It is another object of the invention to provide an automatic test system for multi-pair cables that identifies which wire of a pair is defective.

It is another object of the invention to provide a portable automatic multiple test system for multi-pair cables that utilizes transistor to transistor logic circuits.

It is another object of the invention to provide a new and improved portable automatic multiple test system for multi-paired cables that are economical to produce and utilize conventional, currently available components that lend themselves to standard mass production manufacturing techniques.

These and other advantages, features and objects of the invention will become more apparent from the following description taken in connection with the illustrative embodiment in the accompanying drawings.

DESCRIPTION OF THE PREFERRED EMBODIMENT

Figure 1:
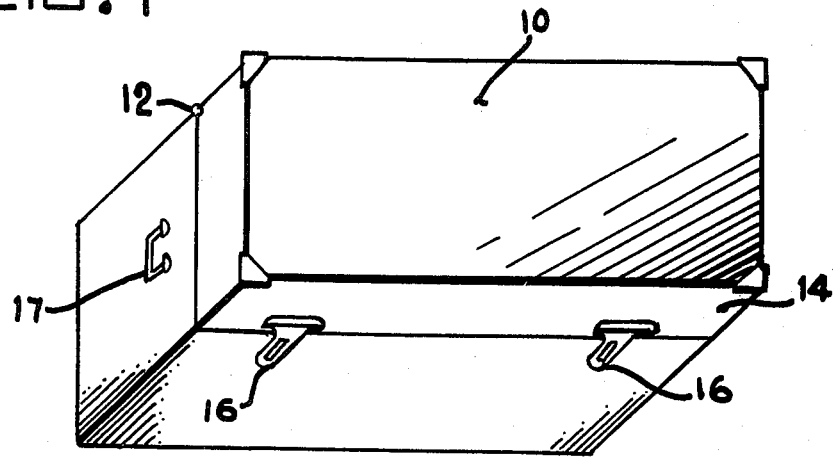
FIG. 1 is a view in perspective of the test system container.

With reference to the drawing, FIG. 1 illustrates the portable test set of the invention. A box like container 10 contains all elements of the testing system. The box may be provided with a hinged (12) cover 14 with conventional snap latches 16 and a handle for carrying 17.

Figure 2:
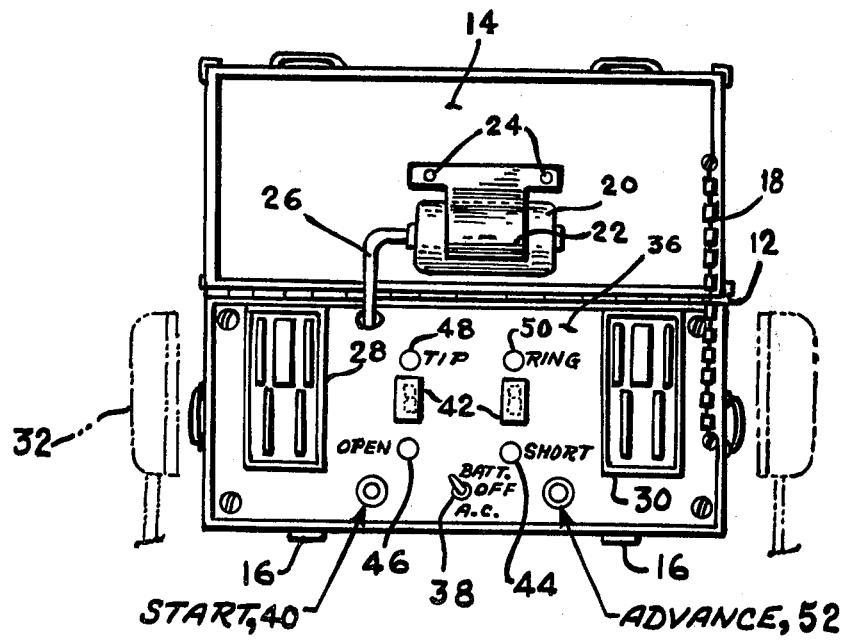
FIG. 2 is a top view of the control-display panel of the invention.

FIG. 2 shows the housing with the cover open. A chain 18 or other suitable means would be appropriate to restrain the cover from opening excessively and damaging the cover. Attached to the inside of the cover is the power supply for the system shown as a battery 20. The battery is secured to the cover by straps 22 which are attached at one end to the cover by screws 24 thereby making removal of the battery more convenient. The power supply is connected electrically to the test system via wires 26.

Within the container are a pair of test plug adapters 28, 30 shown with wire plugs 32, in phantom for purposes of illustration. Control display panel 36 contains three operational controls and five visual indicators. A power ON-OFF switch 38 controls all power to the test system. Start-reset switch 40 resets LED digital indicators 42 and causes the system to begin its scan. LED 44 indicates a short and LED 46 indicates an open. LED's 48 and 50 indicate which wire of the pair is defective, tip or ring respectively. Advance switch 52 causes the system to resume its scan once it has been stopped by a defect indication.

Figure 3:
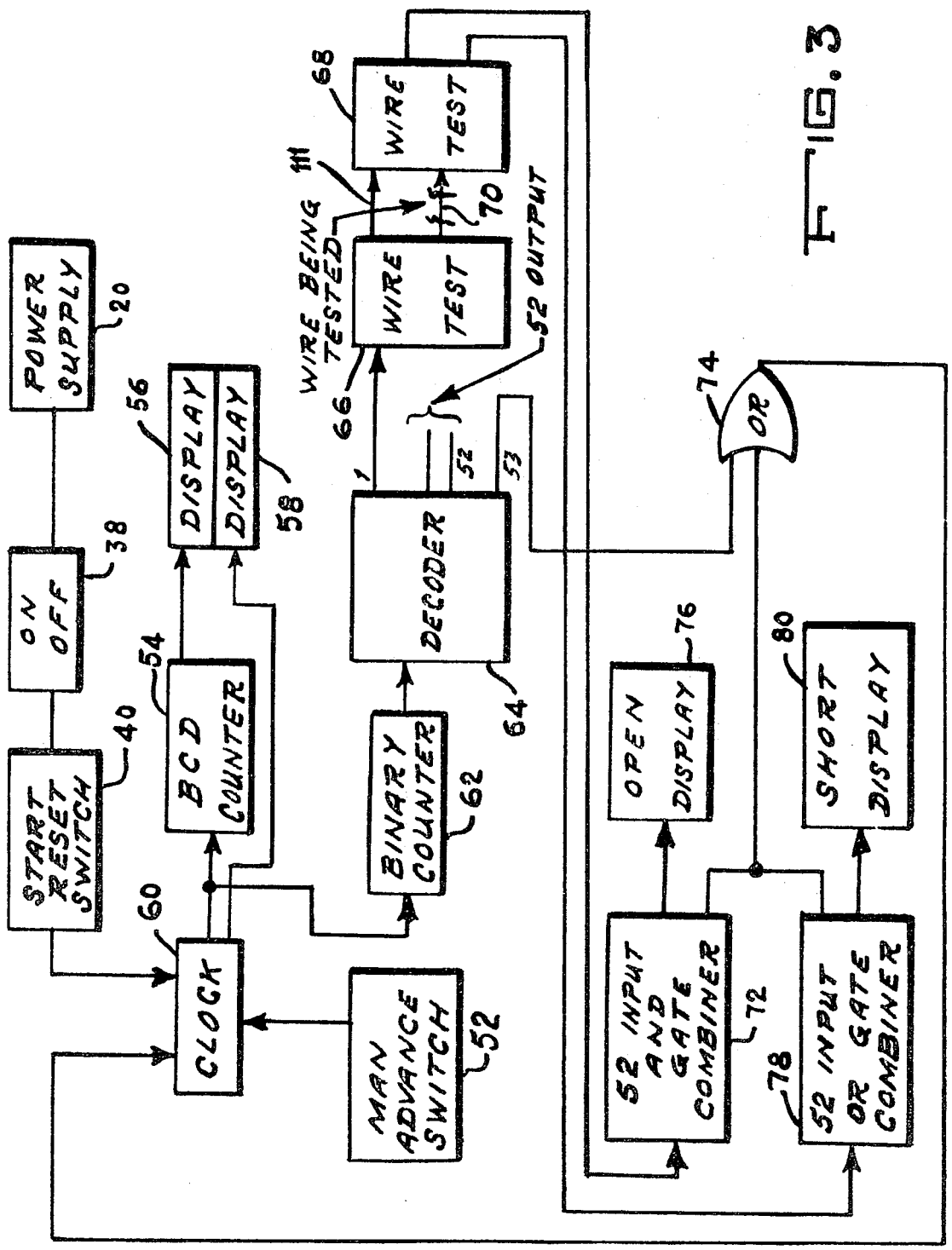
FIG. 3 is a block diagram of the system of the invention.

FIG. 3 shows in block diagram form, the system of the invention. The power supply 20 is connected through ON-OFF switch 38 to START-RESET switch 40. Activation of switch 40 resets the binary coded decimal (BCD) counter 54 and LED display 56, 58 and additionally activates free running clock 60. The clock outputs approximately sixteen pulses per second and feeds the BCD counter which counts clock pulses and provides BCD information to the display section. Block 56 utilizes a standard seven segment light emitting diodes cascaded for a two digit display. Block 58 is an odd-even display and functions with block 56 to display the specific wire of the pair under test, e.g., tip or ring. A manual advanced switch 52 provides a method of advancing the BCD and test counters to continue testing after clock 60 is stopped when a defect is found, as will be explained hereinafter.

The output from clock 60 is also sent to binary counter 62 which sends a binary count of clock pulses to drive the decoder circuit 64. The decoder circuit then takes binary information from binary counter 62, and provides it to each of fifty-three outputs, thereby allowing each wire of a twenty-six paired cable to be tested as an individual basis. The additional output (fifty-three) provides a signal to stop the clock when the entire cable has been tested.

The wire test circuit 66 provides the input to the wire being tested and provides for drivers to feed each wire. Although fifty-two circuits are required to test the fifty-two wires in a twenty-six paired cable for purposes of illustration and convenience only one circuit will be shown since the circuits are identical. Wire test circuit 68 is the output test circuit and compares the wire being tested for a known condition and in this circuit it is determined if the wire is good, open or shorted. Two outputs are provided to show open or short conditions. The cable under test (70) is connected between input circuit 66 and output circuit 68. Wire 111 represents a plurality of wires, one wire for each wire in cable 70 detailed in FIG. 4B.

Open circuit information from wire test circuit 68 is fed to "AND" gate combiner 72. This circuit is effectually a fifty-two input AND gate and collects information from all test circuits and combines it in order that information from each tested wire is combined into one output which will drive "OR" gate 74. Output from combiner 72 also operates the LED open display 76.

Short circuit information from wire test circuit 68 is fed to the "OR" gate combiner 78 where short information from the fifty-two tested wires is combined into one output which will also drive OR gate 74. Output from combiner 78 operates the LED short display 80.

OR gate 74 is driven then by either the fifty third output from decoder 64, a signal showing an open or a signal showing a short in the wires under test. If any of these conditions exist OR gate 74 sends a signal to clock 60 which causes the clock to stop. The clock is restarted by either the manual advance switch 52 or start-reset switch 40.

FIGS. 4A, 4B, 4C and 4D refer to the specific circuit of the invention. Where applicable, boxes represent integrated circuits utilizing Transistor-to-Transistor Logic and specific information and technical data describing the circuits may be found in the *T.T.L. Data Book for Design Engineers*, published by Texas Instruments Corporation.

Figure 4A:
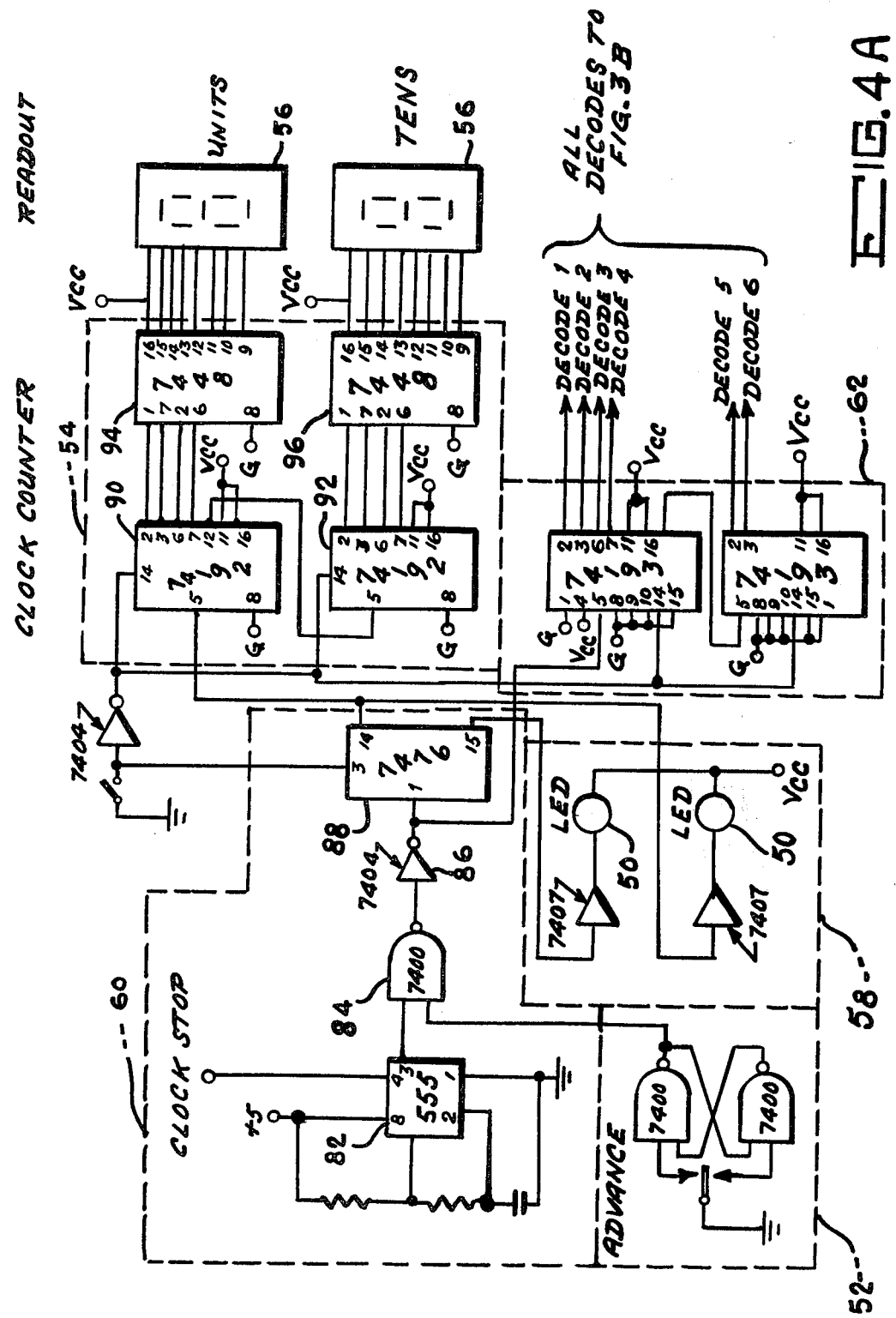
FIGS. 4A, 4B, 4C and 4D are circuit diagrams of the invention utilizing blocks to represent conventional and available subsystem components.
Figure 4B:
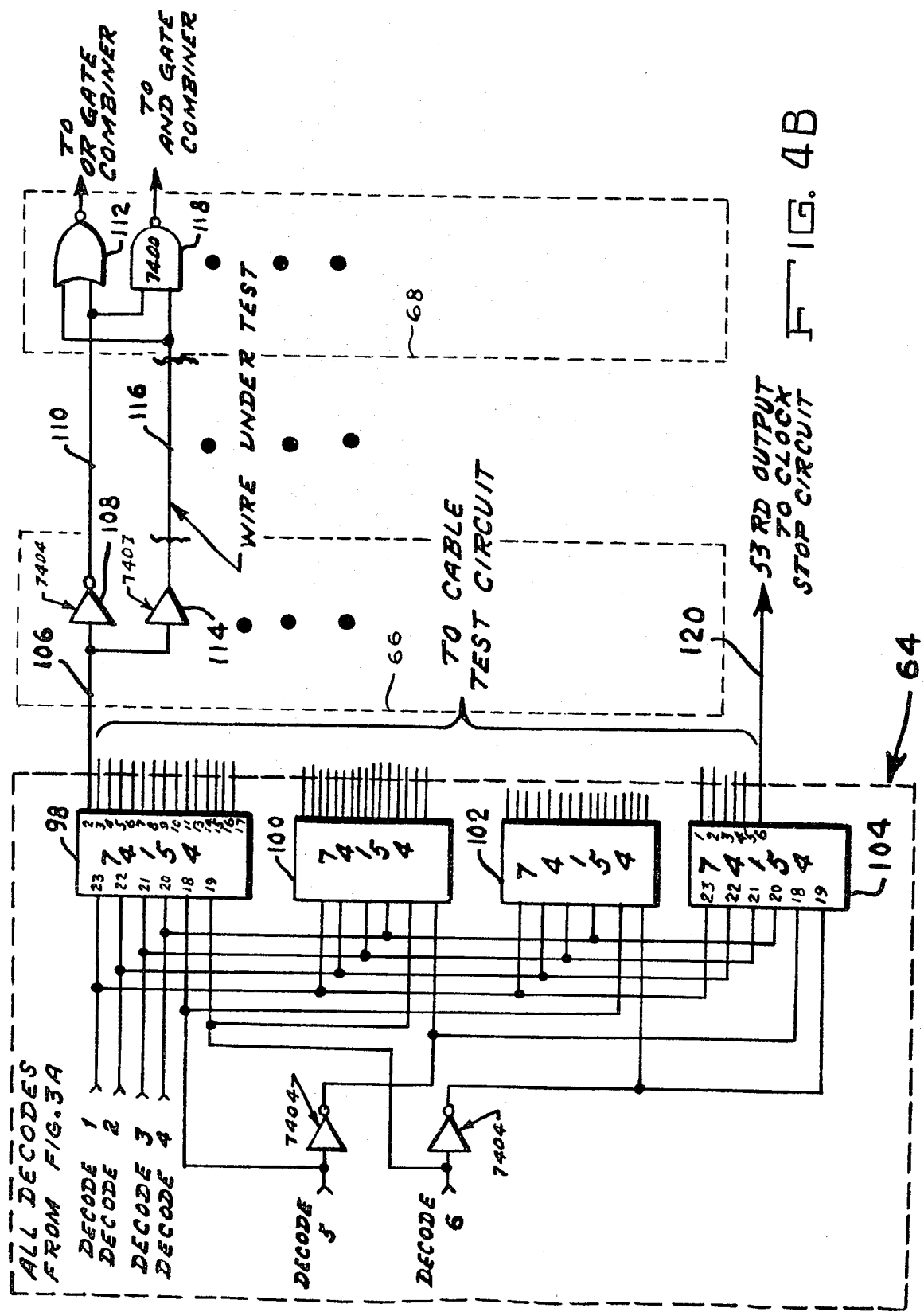
Figure 4C:
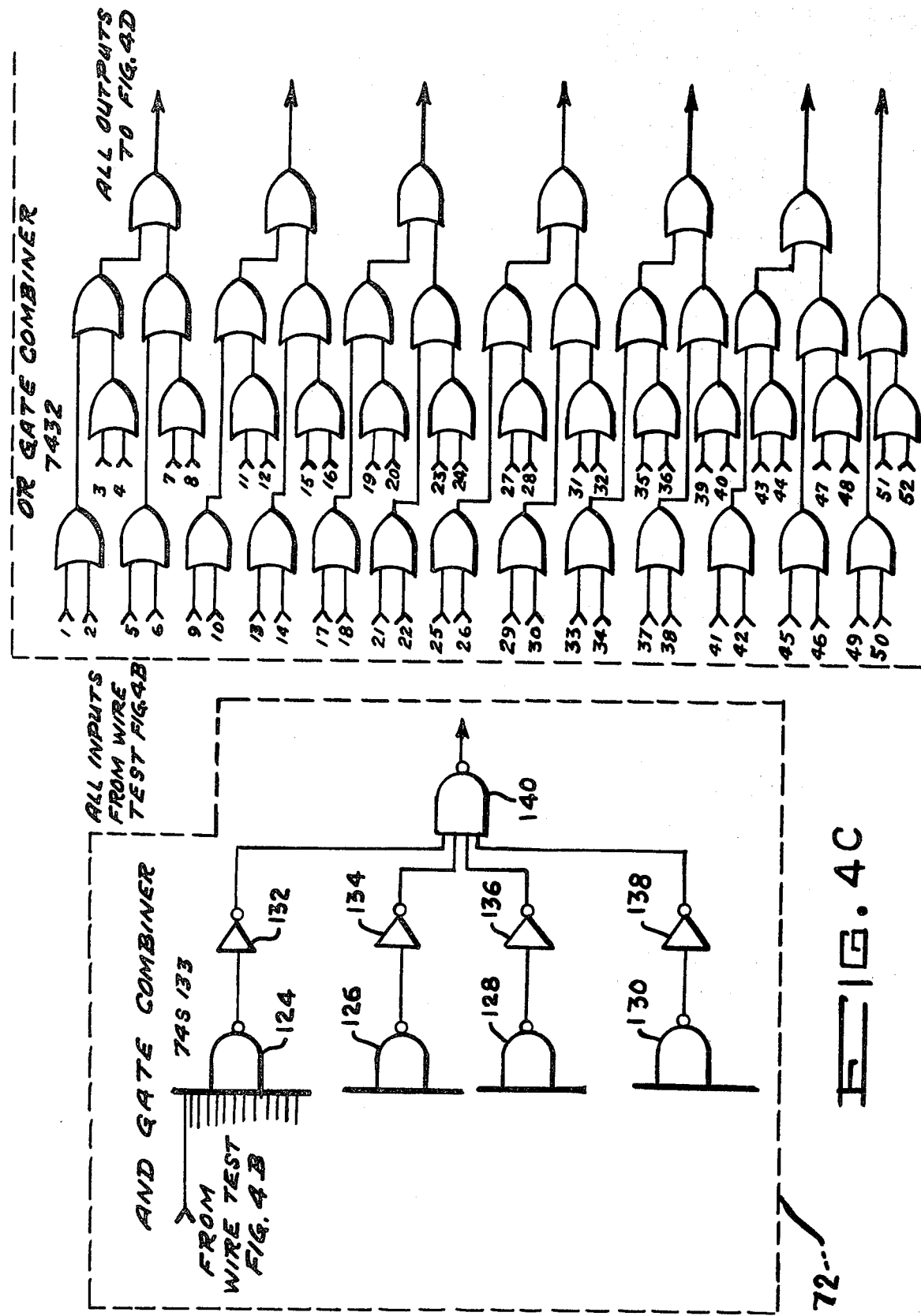
Figure 4D:
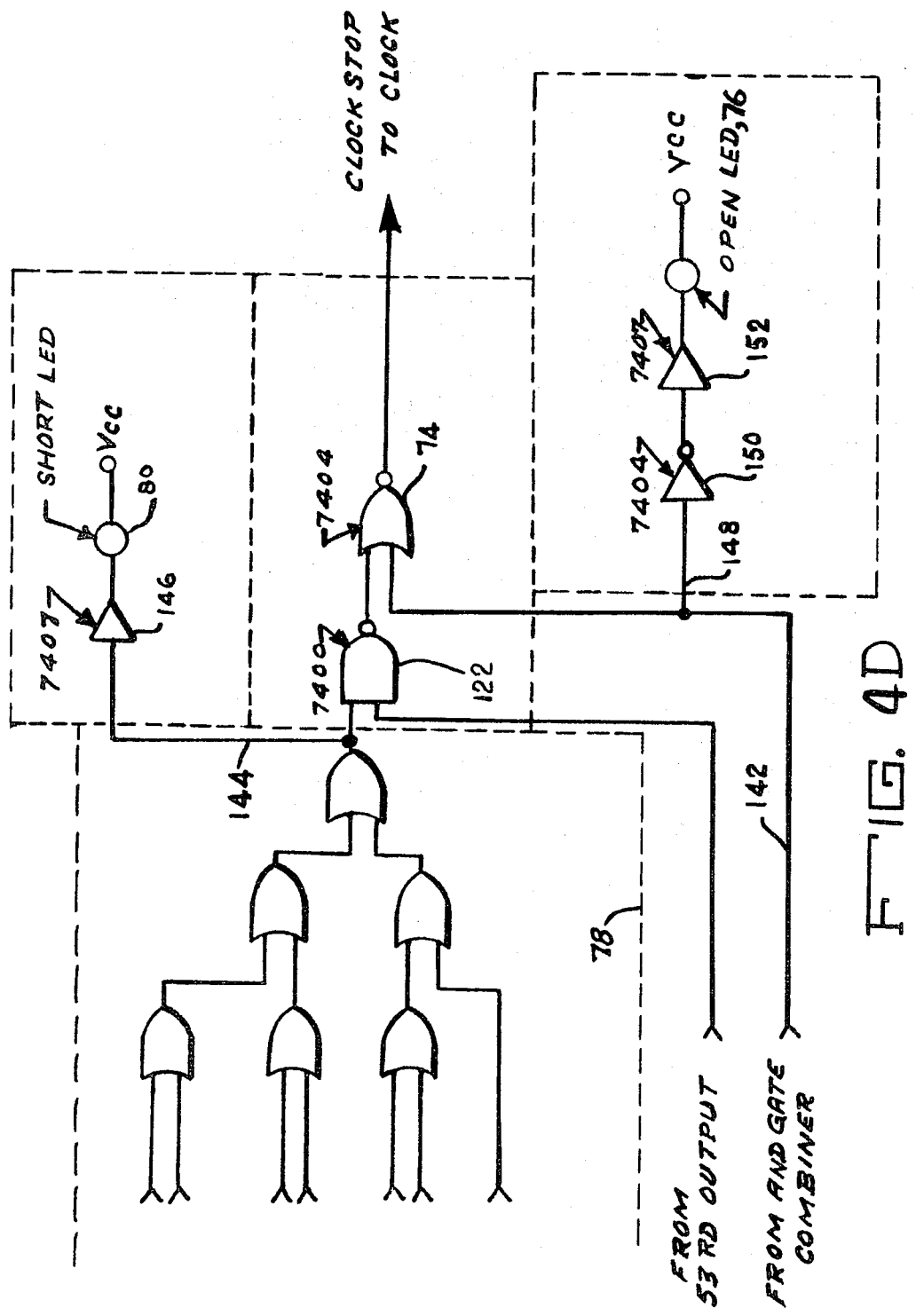

Concerning FIG. 4A, the components of FIG. 3 are shown in dashed lines with their corresponding reference numerals. Clock 60 consists of a standard NE 555 timer 82 that sends approximately sixteen pulses per second through NAND gate 84 and inverter gate 86 to a 7476 microprocessor circuit 88. Manual advance switch 52 is also connected through NAND gate 84 to the microprocessor. Output from the processor is sent to display 58 where LED's identifying the tip 48 and ring 50 wires are located. Connected to the processor is BCD counter 54 and binary counter 62. The BCD consists of a pair of 74192 counters (90, 92) for the units and tens display (56) and a pair of 7448 decoders 94, 96 which convert the clock pulses to information useable by the seven segment LED's (56).

BEST AVAILABLE COPY

Binary counter 62 provides six outputs to decoder 64 containing four, 1 of 16 decoders 98, 100, 102 and 104. This allows system to start with zero then progress to wire 1, 2, 3 etc. as counter 62 counts clock pulses. The pulses pass through wire under test as shown by example for one wire. This circuit is duplicated fifty-one more times for a twenty-six pair cable.

Using open collector logic, line 106 from decoder 64 passes a logical low pulse through the 7404 inverter gate 108, to test for short circuits in the cable. Line 110 represents only one of fifty-two wires 111, hardwired between input test circuit 66 and output test circuit 68.

Using reverse logic and comparing all wires in the cable to the wire under test (in OR gate combiner 78) a logical high output from NOR gate 112 indicates a good circuit i.e., no short defect.

Using conventional logic, the logical low passes through 7407 gate 114 through the wire under test 116 to NAND gate 118. An open circuit will cause an output from NAND gate 118 which is processed in AND gate combiner 72 and an indication of a defect. If the wire is fault free NAND gate 118 will have no output indicating a closed circuit output.

The fifty third output 120 is sent to the 7400 NAND gate 122 FIG. 3D and stops clock 60 when the fifty two wires have been tested.

Output from NAND gate 118 is sent to the AND gate combiner 72 (745133 processor) where the signals from all circuits are combined and reduced to a single output via NAND gates 124, 126, 128, 130, inverter gates 132, 134, 136, 138 and NAND gate 140. The output signal, if any, is sent via line 142 (FIG. 4D) to NOR gate 74 where a pulse will be sent to clock 60 and the scanning stopped.

Output (if any) from NAND gate 112 is sent to OR gate combiner 78 where the signals from all the wires are reduced to a single output via a series of OR gates sent through NAND gate 122 to NOR gate 74 and to clock 60.

The signal from OR gate combiner follows line 144 to 7407 gate, 146 to the open LED 76. Similarly, a signal from the AND gate combiner follows line 142 to 148 through 7404 inverter gate 150, 7407 gate 152 to short LED 80.

Although the invention has been described with reference to a particular embodiment, it will be understood to those skilled in the art that the invention is capable of a variety of alternative embodiments within the spirit and scope of the appended claims.

I claim:

1. A portable multi-pair cable tester for automatically and sequentially testing wires of said cable, said tester comprising:
    driver means for outputting a controlled sequence of pulses upon receiving electrical power;
    overide means for effecting continued sequential testing after said tester determines a short or an open circuit condition in any one of said wires connected to said driver means;
    first display means for displaying a number corresponding to a wire pair under test, said first display means including a BCD counter connected to said driver means, a multi-digit display driven by said BCD counter for indicating which of said wire pairs is under test, and a pair of LEDs connected to said driver means for indicating whether a wire under test is a tip or ring;
    counting means for counting the controlled sequence of pulses from said driver means, said counting means connected for outputting a plurality of coded signals;
    decoding means for decoding the plurality of coded signals and connected for outputting of pulses, said decoding means connected to said counting means and outputting a sequential pulse to each of said wires under test of said multi-pair cable, said decoding means upon completing testing of all wires of said cable outputting a clock stop pulse;
    test means for testing wires of said multi-pair cables having connectors on each end of said cable to said test means, said test means including an input wire test circuit having drivers and inverters therein connected between said decoding means and one end of said cable, and an output wire test circuit having gates connected to the opposite end of said cable and to said input wire test circuit;
    combining means connected to said output wire test circuit, said combining means includes a first combiner for outputting a pulse in response to a short circuit condition and a second combiner for outputting a pulse in response to an open circuit condition;
    second display means for displaying open and short circuit condition connected to said combining means; and
    gate means for receiving the clock stop pulse of said decoding means and said combining means, and outputting a stop pulse to said driver means when said tester has determined an open or short circuit condition and when said testing has been completed.

2. A portable multi-pair cable tester as defined in claim 1 wherein said input wire test circuit has a plurality of first test circuits equal in number to the number of wires in said cable, each of said first test circuits comprising an inverter and a driver connected in parallel to receive said sequential pulses from said decoding means, said driver having an output connected to one of said wires under test, and wherein said output wire test circuit has a plurality of second test circuits equal in number to the number of wires in said cable, each of said second test circuits comprising a NOR gate and a NAND gate, said NOR gate having a first input connected to the output of said inverter and a second input connected to a first input of said NAND gate, said NAND gate having said first input connected to the other end of said wire under test of said cable, said NOR gates connected to said first combiner and said NAND gates connected to said second combiner.

3. A portable multi-pair cable tester as defined in claim 1 wherein said first combiner includes a plurality of gates, said gates outputting said pulse for a short circuit condition to said second display means and to said gate means.

4. A portable multi-pair cable tester as defined in claim 3 wherein said first combiner comprises a plurality of OR gates operably connected to said NOR gates of said second test circuit, said first combiner outputting said pulse indicating a short circuit condition to said second display means.

5. A portable multi-pair cable tester as defined in claim 4 wherein said first combiner comprises 26 first OR gates, each of said first OR gates having two inputs connected to receive outputs from two NOR gates of said second test circuits; second OR gates, each of said second OR gates having two inputs connected to receive outputs from two of said first OR gates; third OR gates, said third OR gate having two inputs connected to receive outputs from two of said second OR gates; fourth OR gates, said fourth OR gates having two inputs connected to receive outputs from two of said third OR gates; fifth OR gates, said fifth OR gates having one fifth OR gate having two inputs from said fourth OR gates and a second fifth OR gate having one input from said fourth OR gates and another input from one of said second OR gates; a sixth OR gate, said sixth OR gate having two outputs connected to receive outputs from said fifth OR gates, said sixth OR GATE outputting said pulse indicating a short circuit condition.

6. A portable multi-pair cable tester as defined in claim 2 wherein said second combiner includes a plurality of NAND gates and inverters whereby said pulse indicating an open circuit condition is transmitted to said second display means and said pulse causes said gate means to transmit said stop pulse to said driver means.

7. A portable multi-pair cable tester as defined in claim 6 wherein said plurality of gates and inverters include NAND gates having one input from each of said NAND gates of said second test circuit; said inverters having one input from each of said first NAND gates of said second combiner and one output; a second NAND gate connected to receive said outputs of said inverters and connected to output said pulse indicating an open circuit conditions to second display means and to said gate means.

8. A portable multi-pair cable tester as defined in claim 1 wherein said gate means includes a NAND gate connected to receive said pulse indicating a short from said first combiner, and said clock stop pulse from said decoding means, said NAND gate connected to output a first inhibit pulse to a NOR gate, said NOR gate connected to receive said first inhibit pulse and said pulse indicating an open circuit from said second combiner, said NOR gate connected to output said stop pulse to said driver means.

* * * * *